US007473649B2

(12) United States Patent
Leith et al.

(10) Patent No.: US 7,473,649 B2
(45) Date of Patent: Jan. 6, 2009

(54) METHODS FOR CONTROLLING FEATURE DIMENSIONS IN CRYSTALLINE SUBSTRATES

(76) Inventors: Steven D Leith, 3370 NW. Summerhill Pl., Albany, OR (US) 97321; Jeffrey S Obert, 1000 NE. Circle Blvd., Corvallis, OR (US) 97330-4239; Eric L. Nikkel, 23496 Whitman Pl., Philomath, OR (US) 97370; Kenneth M Kramer, 3864 NW Estaview Pl., Corvallis, OR (US) 97330

( * ) Notice: Subject to any disclaimer, the term of this patent is extended or adjusted under 35 U.S.C. 154(b) by 194 days.

(21) Appl. No.: 11/492,518

(22) Filed: Jul. 24, 2006

(65) Prior Publication Data

US 2006/0264055 A1 Nov. 23, 2006

Related U.S. Application Data

(62) Division of application No. 10/977,090, filed on Oct. 29, 2004, now Pat. No. 7,105,456.

(51) Int. Cl.
*H01L 21/302* (2006.01)
*H01L 211/461* (2006.01)

(52) U.S. Cl. ........................ 438/733; 438/689; 438/680; 257/E21.17; 257/E21.218; 257/E21.221; 257/E21.229; 257/E21.293; 257/E21.278; 257/E21.475

(58) Field of Classification Search ................. 438/733, 438/9, 637, 680, 689, 700, 706, 712, 743, 438/744, 745, 746, 756, 757, 780
See application file for complete search history.

(56) References Cited

U.S. PATENT DOCUMENTS

| | | | |
|---|---|---|---|
| 4,579,812 | A | 4/1986 | Bower |
| 5,569,355 | A | 10/1996 | Then et al. |
| 5,698,870 | A | 12/1997 | Nakano et al. |
| 5,698,900 | A | 12/1997 | Bozada et al. |
| 5,877,791 | A | 3/1999 | Lee et al. |
| 6,171,510 | B1 | 1/2001 | Lee |
| 6,218,309 | B1 | 4/2001 | Miller et al. |
| 6,376,833 | B2 | 4/2002 | Shimada et al. |
| 6,420,196 | B1 | 7/2002 | Silverbrook |
| 6,555,480 | B2 | 4/2003 | Milligan et al. |
| 6,630,410 | B2 | 10/2003 | Trapp et al. |
| 6,648,454 | B1 | 11/2003 | Donaldson et al. |
| 6,672,712 | B1 | 1/2004 | Donaldson et al. |
| 6,821,450 | B2 | 11/2004 | Truninger et al. |
| 6,893,577 | B2 | 5/2005 | Chen et al. |

(Continued)

FOREIGN PATENT DOCUMENTS

| | | |
|---|---|---|
| WO | WO01/59834 | 8/2001 |

*Primary Examiner*—David Nhu

(57) ABSTRACT

A method of forming a slot in a substrate comprises growing an oxide layer on a first side of a substrate, patterning and etching the oxide layer to form an opening, forming a material overlying the opening and the oxide layer, removing substrate material through a second side to a first distance from the first side, and anisotropic etching the substrate to create a substrate opening at the first side which is aligned with the opening in the oxide layer during anisotropic etching. The material overlying the opening and the oxide layer is selected so that an anisotropic etch rate of the substrate at an interface of the material and the substrate is greater than an anisotropic etch rate of the substrate at an interface of the oxide layer and the substrate.

22 Claims, 10 Drawing Sheets

U.S. PATENT DOCUMENTS 6,910,758 B2 * 6/2005 Truninger et al. ............. 347/47
6,951,383 B2 * 10/2005 Giere et al. ................... 347/56
7,105,456 B2 * 9/2006 Leith et al. .................. 438/733
7,213,908 B2 * 5/2007 Chwalek et al. ............... 347/65
2004/0100518 A1 5/2004 Silverbrook
2004/0160495 A1 8/2004 Silverbrook
2004/0165036 A1 8/2004 Lee et al.

* cited by examiner

METHODS FOR CONTROLLING FEATURE DIMENSIONS IN CRYSTALLINE SUBSTRATES

CROSS-REFERENCE TO RELATED APPLICATIONS

This application is a Divisional of U.S. patent application Ser. No. 10/977,090, filed on Oct. 29, 2004 now U.S. Pat. No. 7,105,456, which is incorporated herein by reference.

BACKGROUND

The market for electronic devices continually demands higher performance at lower costs. In order to meet these requirements, the components which comprise various electronic devices need to be made more efficiently and to closer tolerances.

One type of electronic device is a fluid ejection device that ejects fluid via one or more orifices. In certain types of fluid ejection devices, a fluid feed channel or slot is formed to feed fluid to chambers in which the fluid is heated and ejected via the one or more orifices. In order to be able to eject fluid in a timed a precise matter, slot or channel needs to be aligned within certain tolerances.

In some embodiments, the slot is formed in the substrate by wet chemical etching of the substrate with, for example, Tetra Methyl Ammonium Hydroxide (TMAH) or potassium hydroxide (KOH). The etch rate for alkaline chemistries is different for different crystalline planes, and therefore the etch geometry is defined by the orientation of the crystalline planes. For example, on {100} substrates, TMAH etching techniques result in etch angles that cause a very wide backside slot opening. The wide backside opening limits how close the slots can be placed to each other on the die.

In addition, in many fluid ejection devices, different fluid passages should be aligned with each other in order to prevent potential damage to the fluid ejection device and to maintain proper operation. In some cases, slots or trenches within a fluid ejection device that are not properly aligned can lead to chipping of substrate material that can clog other fluid passage ways thereby damaging or making non-functional the fluid ejection device.

Therefore, It is desired to efficiently align slots or trenches in a substrate within desired dimensional tolerances.

DETAILED DESCRIPTION

Figure 1:
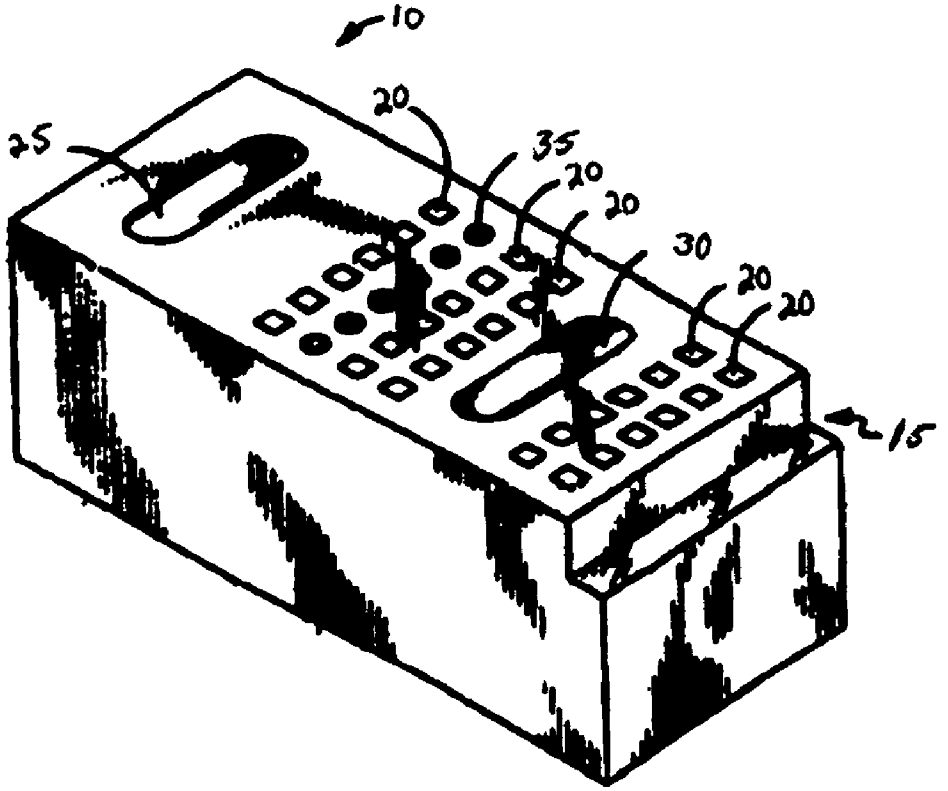
FIG. 1 illustrates a perspective view of an embodiment of a fluid ejection device.

Referring to FIG. 1, an enlarged, view of one embodiment of a fluid ejection device 10 in a perspective view is illustrated. The fluid ejection device 10 may have multiple features, such as an edge step 15 for an edge fluid feed to fluid ejectors 20, such as heating elements or resistors. The fluid ejection device 10 may also have a trench 25 that is partially formed into the substrate surface. Fluidically, a slot (or channel) 30 feeds fluid to be ejected by fluid ejectors 20. Also, a series of holes 35 may be used to feed fluid to fluid ejectors 20. In one embodiment there may be at least two of the features described on the fluid ejection device 10 in FIG. 1. For example, only the feed holes 35 and the slot 30 may be used, where in an alternative embodiment the edge step 15 and/or the trench 25 are also used. In another example, only the edge step 15, and the slot 30 are formed in the fluid ejection device 10, where in an alternative embodiment one of trench 25 or feedholes 35 are formed as well.

Figure 2:
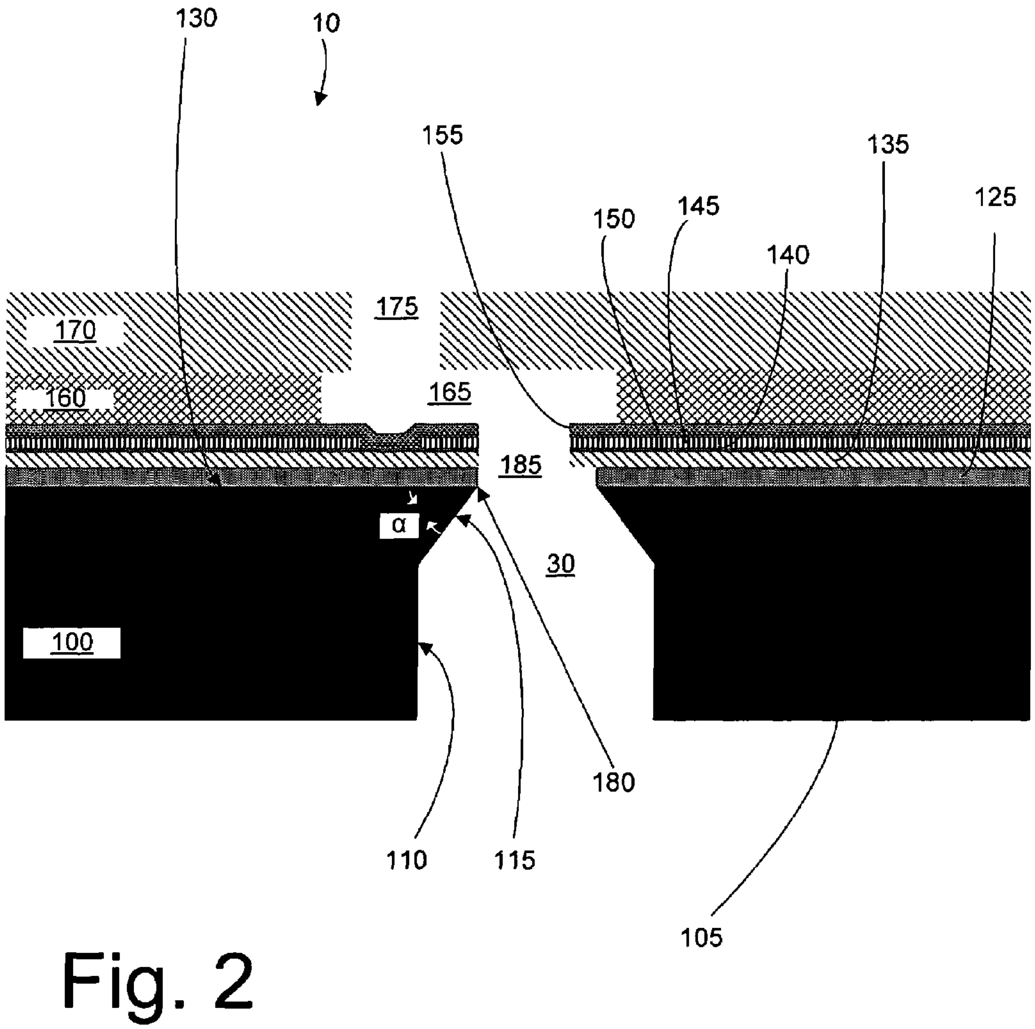
FIG. 2 illustrates a cross-sectional view of an embodiment of a fluid ejection device.

FIG. 2 illustrates a cross-sectional view of an embodiment of a fluid ejection device is illustrated. Fluid ejection device 10 includes a slot 30 that extends between a first side 130 and a second side 105 of substrate 100, along a first side wall portion 110 and a second side wall portion 115. In one embodiment, the substrate 100 is a silicon wafer with a <100> crystalline orientation, such that the wafer is etched at an angle $\alpha$ of between about 49 degrees and about 59 degrees between first side 130 and a second side wall portion 115. However, other angle ranges may also be utilized. While FIG. 2 depicts a single slot, other embodiments may utlize multiple slots that are formed in any desired pattern. Further, in other embodiments, the spacing between adjacent slots in the die or substrate may be as low as 10 microns.

In FIG. 2, an insulative layer 125 is formed on a first side 130 of substrate 100. In some embodiments, insulative layer 125 may be a field oxide layer that is thermally grown on first side 130 of substrate 100. Thin film layers (active layers, a thin film stack, electrically conductive layers, or layers with micro-electronics) 135, 140, 145, 150 and 155 are formed, e.g. deposited then patterned and etched, on insulative layer 125. The first side 130 is opposite a second side (or surface) 105 of the substrate 100. The thin film layers 135, 140, 145, 150 and 155 include at least one layer formed on the substrate, and, in a particular embodiment, masks at least a portion of the first side 130 of the substrate 100. A barrier layer or layers 160 formed overlying thin film layers 135, 140, 145, 150 and 155 defines a volume of chamber 165. An orifice layer 170 overlies the chamber layer and includes an orifice 175 defined therein.

Channel 30 is formed so that the second side wall portion 115 extends from the first side wall portion 110 to be aligned with an edge 180 of insulative layer 125. As such, the alignment creates improved fluid flow and reduces potential debris formation due to fluid flow.

In one embodiment, opening 185 is formed through the layers 125, 135, 140, 145, 150 and 155 formed upon the substrate 100. The opening 185 fluidically couples the chamber 165 and the slot 30, such that fluid flows through the slot 30 and into the chamber 165 via opening 185. Fluid in the chamber 165 is ejected via orifice 175 after being heated by a heating element, such as a resistor, which in some embodiments may reside directly below orifice 175 in the thin film layers.

As shown in the embodiment of FIG. 2, the thin film layers include a capping layer 135, a resistive layer 140, a conductive layer 145, a passivation layer 150, and a cavitation barrier layer 155, each formed or deposited over the first side 130 of the substrate 100 and/or the previous layer(s). In one embodiment, the substrate 100 is silicon. In various embodiments, the substrate may be formed of other crystalline semiconductor materials, such as gallium arsenide, gallium phosphide, and indium phosphide. The substrate may be doped or undoped. The various materials listed as possible substrate materials are selected depending upon the application for which they are to be used. In one embodiment, the thin film layers are patterned and etched, as appropriate, to form the resistors in a resistive layer, conductive traces in a conductive layer, and a chamber 165 at least in part defined by the barrier layer. Other structures, layouts of layers, and components may also be utilized.

While FIGS. 1 and 2 refer to utilizing resistors to cause fluid to be ejected, other fluid ejection elements may be utilized. For example, mechanical elements, ultrasonic or piezo-electric transducers may also be utilized. In such cases, channel 30 has substantially the same configuration and positioning as shown in FIG. 2.

Figure 3A:
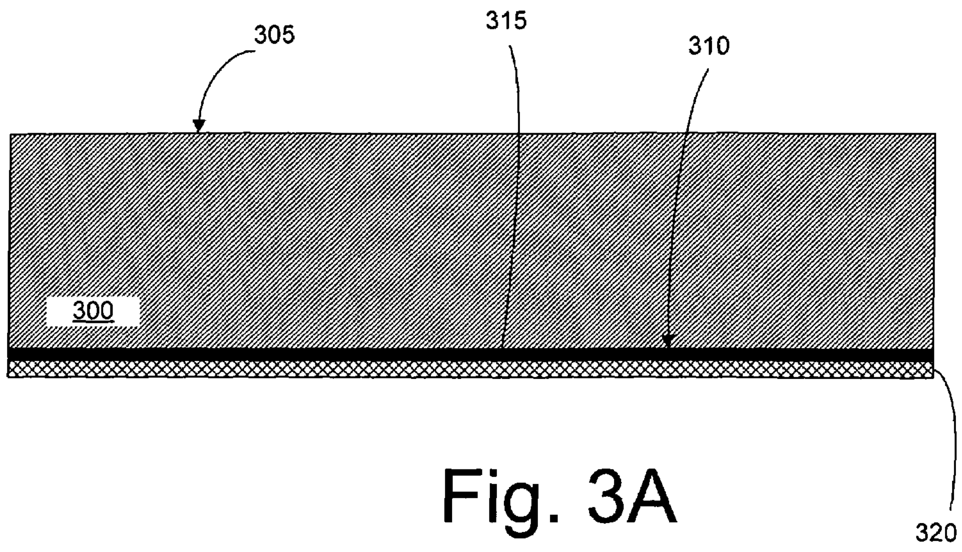
FIGS. 3A-I illustrate cross-sectional representations of process steps showing formation of a through feature in a substrate according to one embodiment.

Referring to FIGS. 3A-3I, cross-sectional representations of process steps showing formation of a through feature in a substrate according to one embodiment are illustrated. In FIG. 3A, substrate 300 is partially defined by a first surface 310 and a substantially opposing second surface 305. First surface 310 includes an insulative layer 315 and thin film layers 320 formed thereon.

In one embodiment, insulative layer 315 may comprise an oxide that is thermally grown on first surface 310. One exemplary process may use a growing time of approximately 1 to 2 hours at 1000 to 1100 C, in oxygen at 80-90% absolute humidity. However, other embodiments may utilize different times, temperatures, and humilities. In one embodiment, insulative layer 315 may be grown in an oven as is known. In other embodiments, the insulative material may comprise other materials and may be formed using other methods.

In some embodiments, the substrate may have a thickness between first surface 310 and second surface 305 ranging from less than approximately 100 microns to more than approximately 2000 microns. One exemplary embodiment can utilize a substrate that is approximately 675 microns thick between first surface 310 and second surface 305. Other embodiments may use different thicknesses.

Figure 3B:
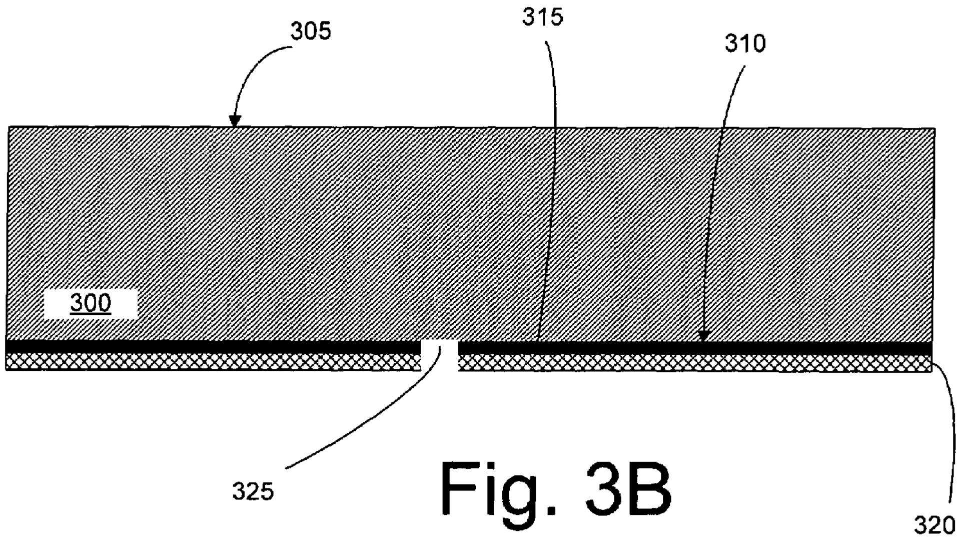

Referring to FIG. 3B, a gap 325 is formed in the insulative layer 315 and thin film layers 320 to create a feed hole or path to allow fluid to flow via a slot, e.g. slot 30. The gap 325 may be formed using know etching, laser ablation, mechanical techniques, or the like. In one embodiment, the gap 325 may be substantially orthogonal with respect to the crystal planes of the substrate. Further, while FIG. 3B depicts the formation of a single gap 325, and thereby a single through feature, the number of gaps formed may vary based upon the application and the desired number of through features.

In certain embodiments, the gap 325 extends into the substrate 300, while in others gap 325 extends only through the insulative layer 315.

Figure 3C:
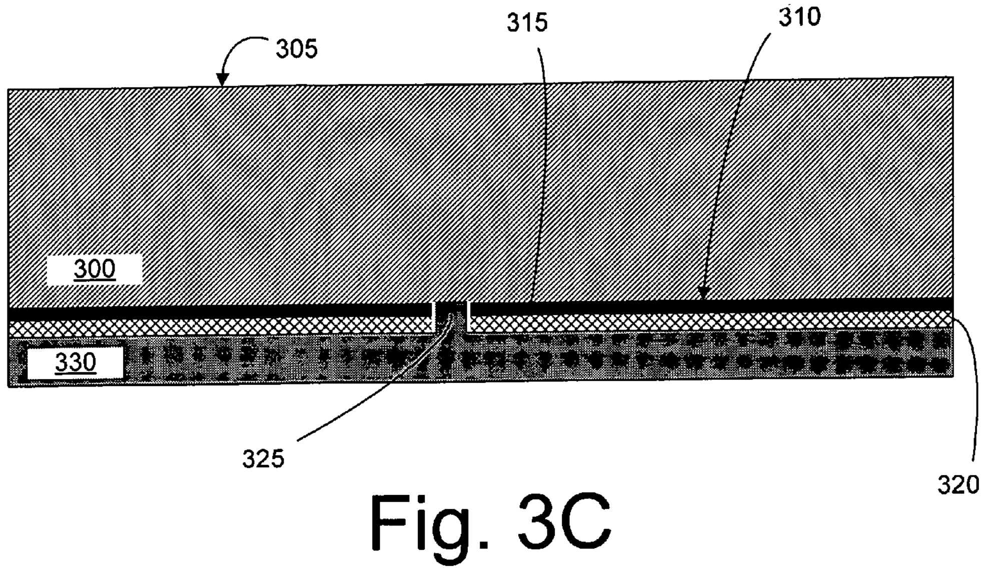

Referring to FIG. 3C, one or more orifice layers 330 are formed overlying thin film layers 320 and filling gap 325. In some embodiments, orifice layers 330 may comprise an orifice layer and a barrier layer. In other embodiments, orifice layers 330 may comprise a barrier layer and an orifice plate. The orifice layer(s) 330 may be formed of polymer materials, metals, dielectrics, combinations thereof, or the like. In some embodiments, the polymer materials may include photo-definable polymer materials such as SU-8 produced and marketed by MicroChem Corporation.

Figure 3D:
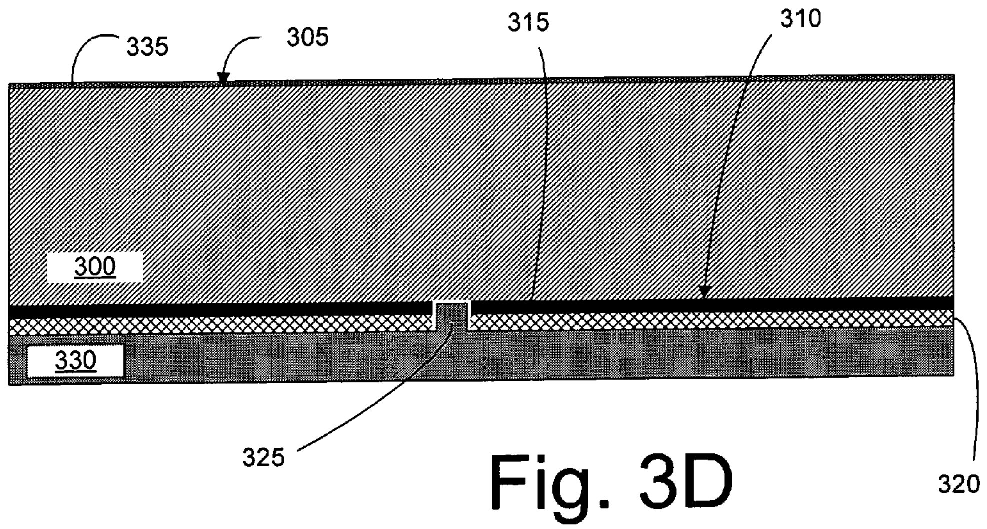

In FIG. 3D, a mask layer 335 is formed overlying second surface 305. Mask layer 335 is provided so that portion of second surface 305 can be protected during the formation of a slot or path through second surface 305. The mask layer 335 may comprise any suitable material. Exemplary materials may include characteristics such that they are substantially resistant to anisotropic etching, do not produce polymeric residues during an etching process, and that are not removed by solvents used to remove photoresist materials. The mask layer 335 may be a grown thermal oxide, a grown or deposited dielectric material such as a CVD (chemical vapor deposition) oxide, TEOS (tetraethoxysilane), silicon carbide, or silicon nitride. Other suitable masking materials may include, but are not limited to, aluminum, copper, aluminum-copper alloys, aluminum-titanium alloys, and gold.

Figure 3E:
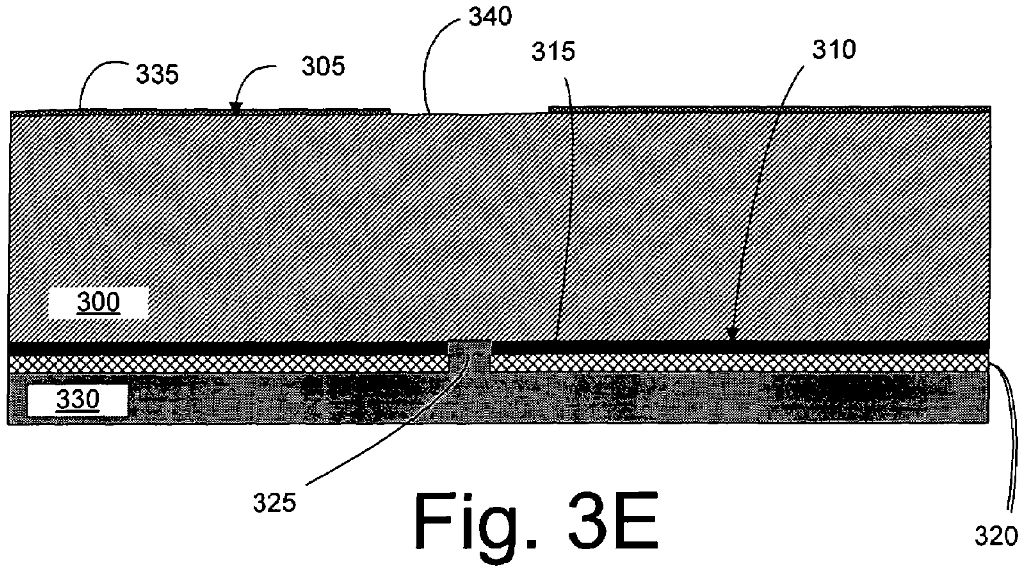

Referring to FIG. 3E, an opening 340 is formed in mask layer 335 so that material may removed via that opening 340 while the remaining surface underlying mask layer 335 is free from substrate removal, damage, and debris generated during substrate removal.

The formation of opening 340 may be performed via patterning of the mask layer 335 and may be accomplished in various suitable ways. For example, a photo-lithographic process may be utilized where the mask layer 335 may be formed over generally all of the second surface 305 and then mask layer 335 material may be removed from the desired area. Methods of removal may include either dry or wet processing.

Figure 3F:
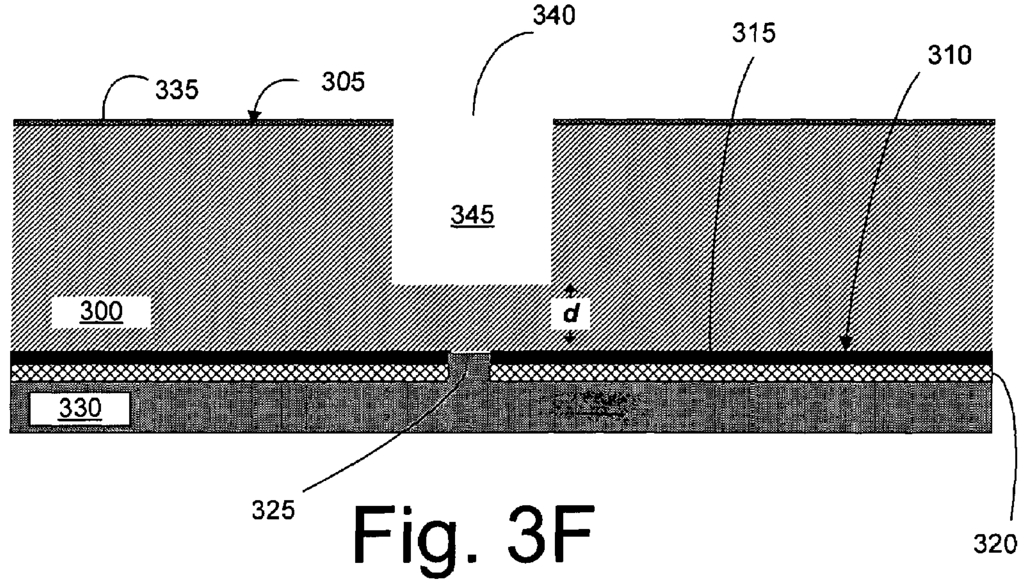

In FIG. 3F, substrate is removed via opening 340 to form a slot 345 using a first substrate removal technique. In one embodiment, the first substrate removal technique may be a plasma etching, deep reactive ion etching, laser machining, ultrasonic micromachining, or a mechanical saw. In further embodiments, an anisotropic etching technique may be utilized to form slot 345. In other embodiments, other techniques may be utilized to form slot 345. In certain embodiments, slot 345 has a substantially uniform cross-sectional area through out its depth, while in other embodiments the cross-sectional area may vary.

The first substrate removal processes ceases, so that a distance d is formed between an end of the slot and the surface of the substrate 300 on which insulative layer 315, thin film layers 320, and orifice layer 330 are formed. In one embodiment, d may be at least 50 microns. In other embodiments, d may be less than fifty microns, such as at least 30 microns.

The determination when to terminate the first substrate removal process may be done a number of ways, including but not limited to, continuously measuring the depth or measuring the depth at predetermined increments. In some embodiments, the depth may be measured by use of a reflectometer or laser-based displacement sensor. One embodiment of a refelectometer and a system that utilizes a reflectometer is depicted and disclosed in copending U.S. patent application Ser. No. 10/771,495, filed Feb. 24, 2004 which is incorporated by reference in its entirety as if fully set forth herein. Alternatively, the first substrate removal technique may terminate after a predetermined time period designed to correspond to a predetermined depth.

Figure 3G:
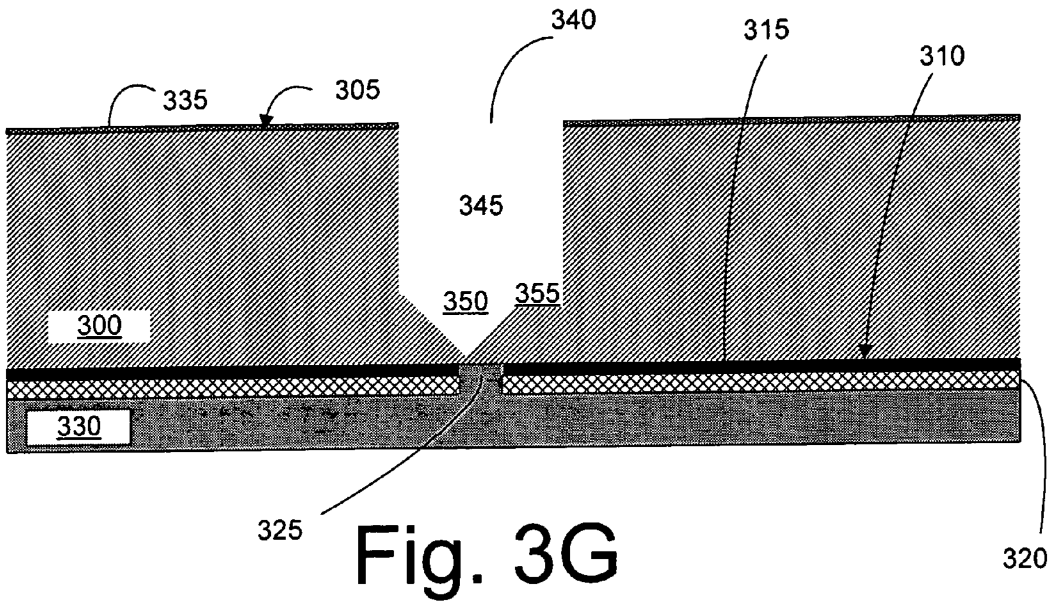

In FIG. 3G, an anisotropic etch is applied to the substrate to remove the remaining material of substrate so that slot 345 allows fluid to flow through substrate 300. The anisotropic etch may be applied, for example, by placing the structure in a etch bath. In one embodiment, the etchant may be TMAH (Tetra Methyl Ammonium Hydroxide). In another embodiment, the etchant may be an anisotropic alkaline etchant, e.g. potassium hydroxide (KOH).

In some embodiments, a time of anisotropic etching may vary between approximately 1 hour and approximately 5 hours. Factors that may be considered in determining a time of anisotropic etching include, but are not limited to, depth of the feature formed by the first removal process and the distance from the end of the feature and a top end of any layers overlying the gap.

As anisotropic etching proceeds, portions of second portion 350 of slot 345 may be etched faster than other portions of second portion 350. This may occur due to weakness along the crystalline plane of the substrate in certain portions that give rise to faster etch rates for those portions. This can be seen in FIG. 3G, as area 355 contains more substrate material than the remainder of second portion 350. Anisotropic etching may include one or more anisotropic etch operations, e.g. multiple periods in an etch bath.

Figure 3H:
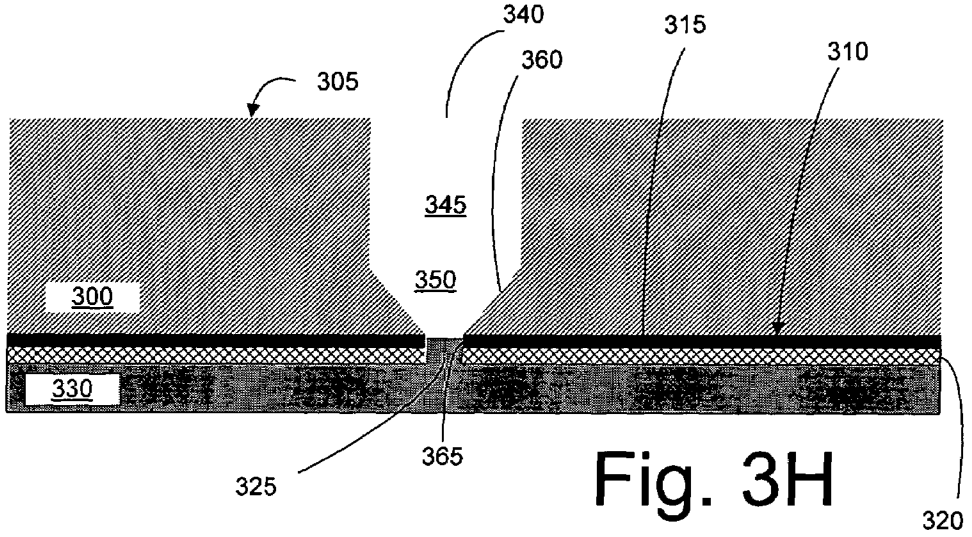

Referring to FIG. 3H, as the anisotropic etching process continues, the substrate material 300 etches at a rate faster than either insulative layer 315 or orifice layer 330. Further, in some embodiments the materials of orifice layer 330 and insulative material 315 are selected so that an anisotropic etch rate of the substrate at an interface of the orifice layer material and the substrate is greater than an anisotropic etch rate of the substrate at an interface of the insulative layer and the substrate. As a result, side walls 360 of second portion 350 of slot 345 will be substantially aligned with the edges 365 of insulative layer 315 that define gap 325.

Figure 3I:
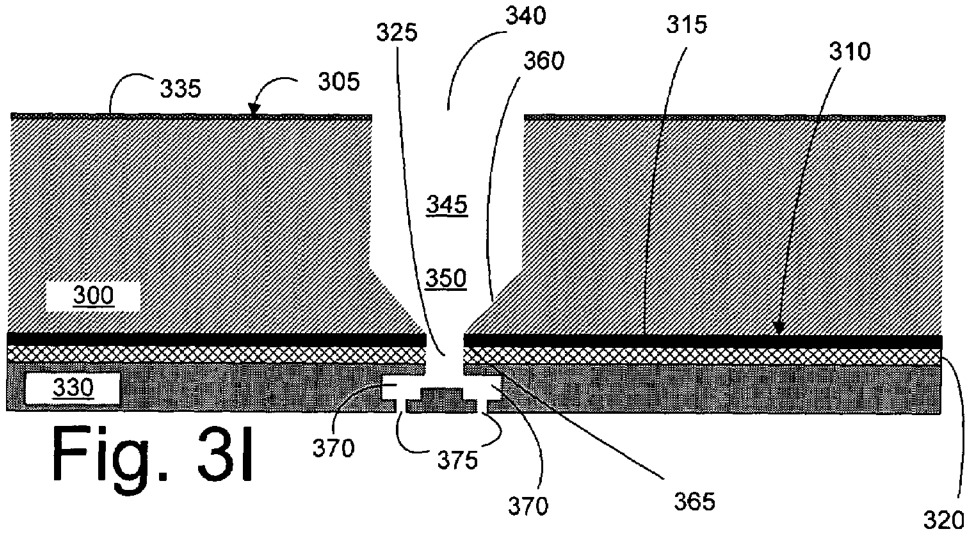

Referring to FIG. 3I, chambers 370 and orifices 375 are formed in orifice layer(s) 330. The chambers 370 and orifices 375 may be formed by developing a polymer material or by etching into metal orifice layers.

It should be noted that while FIG. 3I depicts formation of chambers 370 and orifices 375 after formation of slot 345, chambers 370 and orifices 375 may be formed prior to formation or completion of slot 345. In addition, if chambers 370 and orifices 375 are formed prior to formation or completion of slot 345, chambers 370 and orifices 375 may be filled with a wax or other material during the time when slot 345 is being formed.

Further, while FIG. 3C shows that orifice layers 330 are formed overlying the thin film layers 320 prior to formation of slot 345, it is possible that orifice layers 330 be applied after formation of slot 345. In such a case, the insulative layer 315 is formed, gap 325 is then formed, and then slot 345 is formed. After this the orifice layers are formed.

Further, in certain applications such as micro-fluidic devices or micro-electro-mechanical systems orifices layers may not need to be formed. In such cases, a temporary layer comprised of a polymer, metal, dielectric, combinations thereof or the like may be formed above the insulative layer 315 and in gap 325 and then removed. It is also possible in such instances that gap 325 be open and no layer of material be formed overlying the insulative layer 315 and gap 325.

An advantage of the process shown in FIGS. 3A-3I is that plugs or sacrificial layers are not utilized to align the gap or opening with the slot. The lack of such materials reduces the cost and the number of steps required to form the fluid ejection device.

Figure 4A:
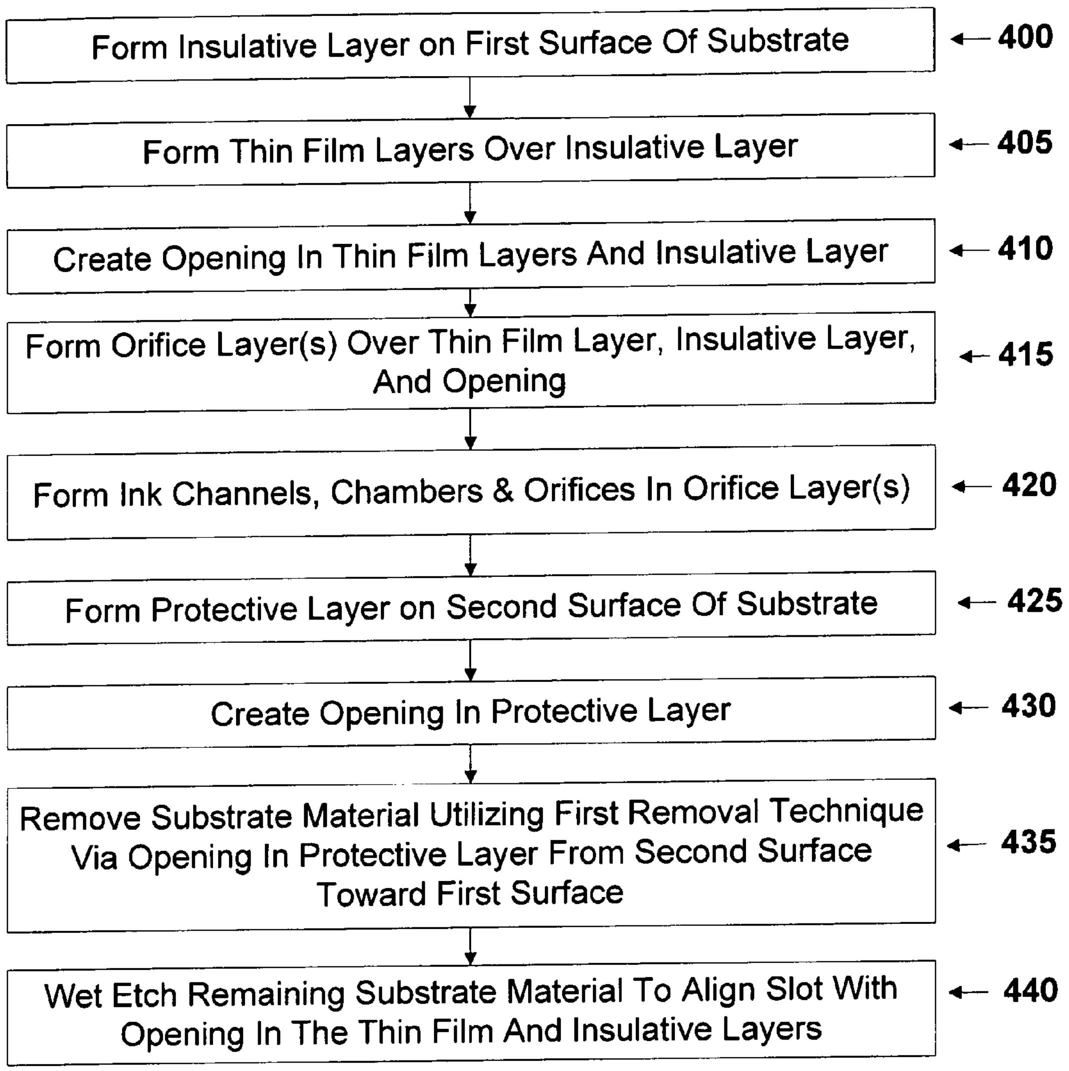
FIG. 4A illustrates a flow chart of a process for forming a through feature in a substrate according to one embodiment.

Referring to FIG. 4A, a flow chart of a process for forming a fluid ejection device according to one embodiment is illustrated. An insulative layer is deposited or grown over a surface of a substrate, block 400. In one embodiment, the insulative layer may be a field oxide and the substrate a silicon wafer. A number of thin film layers are then formed overlying the insulative layer, block 405. The thin film layers form the fluid ejection elements, conductors, and other components that make up a fluid ejection device.

The insulative layer and thin film layers are then patterned and etched to form one or more holes or openings through the insulative layer and thin film layers, block 410. In certain embodiments, the hole or opening may extend into the surface of the substrate over which insulative layer is deposited or grown. In certain embodiments, the hole or opening is solely formed in the insulative layer and thin film layers and does not extend into the surface of the substrate on which insulative layer is formed.

After formation of the opening, one or more orifice layers are formed overlying the thin film layers and openings, block 415. The orifice layers are utilized to form one or more chambers and orifices through which fluid may be controllably ejected by control of the thin film layers. Orifices, chambers, and channels are then formed in the orifice layer(s), block 420. In one embodiment, the orifice layers include a chamber layer, which is patterned and developed to form chambers. After formation of the chambers, a fill material such as wax may be used to fill the chambers, and an orifice layer is applied over the chamber layer. The orifice layer can then be patterned and developed to form orifice that are fluidically coupled with the chambers. The orifices can then be filled with a fill material, while the substrate is further processed.

A protective layer is formed on the surface of the in which the slot is to begin, block 425. An opening is then formed in the protective layer, block 430. The opening is aligned to control the dimensions of the slot on the second side. After formation of the opening, substrate is removed via the opening, block 435. In one embodiment, the substrate removal technique may be a plasma etching, deep reactive ion etching, laser machining, ultrasonic micromachining, or a mechanical saw. In other embodiments, other techniques may be utilized. At a predetermined distance from the surface of substrate, substrate removal ceases.

After the substrate removal ceases, an etch bath is applied to the substrate, block 440. Due to the differing etch rates of the substrate material, orifice layers, and insulative layer, the slot terminates such that it is substantially aligned with the one or more holes or openings formed in the thin film layers and insulative layer.

Figure 4B:
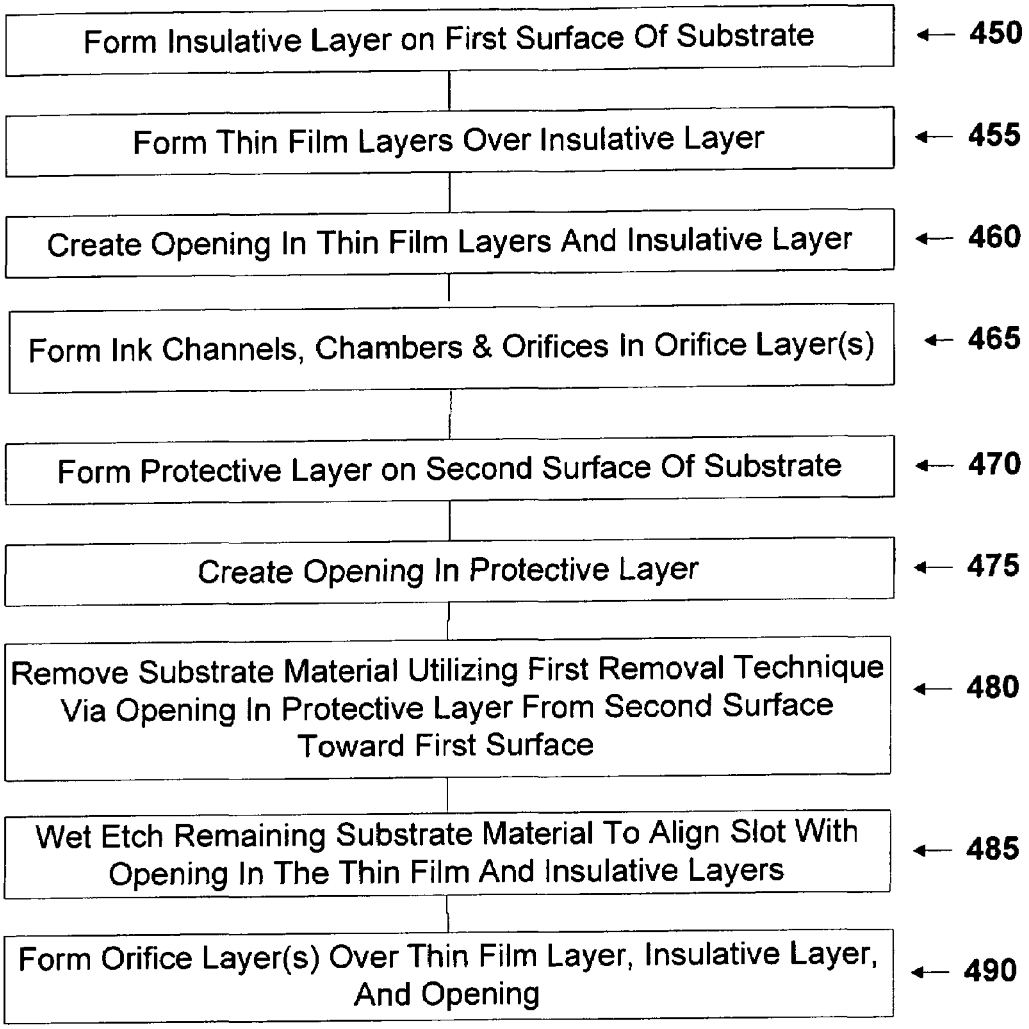
FIG. 4B illustrates a flow chart of a process for forming a through feature in a substrate according to another embodiment.

Referring to FIG. 4B, a flow chart of a process for forming a through feature in a substrate according to another embodiment is illustrated. In FIG. 4B, blocks 450-485 are similar to blocks 400-415 and 425-440, respectively. However, block 490 that relates to creating one or more orifice layers overlying the thin film layers and openings occurs after formation of the openings(s) through the substrate.

Further, in other embodiments blocks 415 and 420 may be performed after blocks 400-410 and 425-440.

Figure 5:
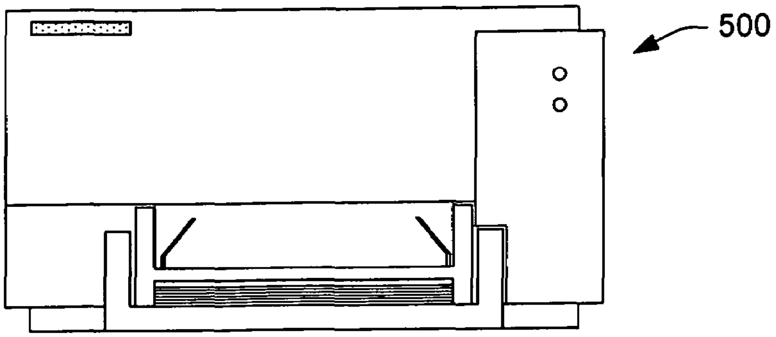
FIG. 5 illustrates a perspective view of one embodiment of a print cartridge.
Figure 6:
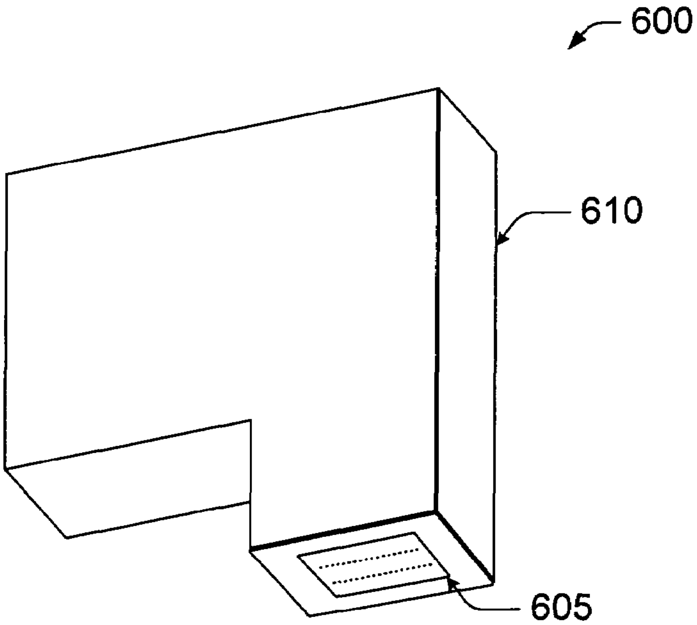
FIG. 6 illustrates a perspective view of an embodiment of a printer.

FIGS. 5 and 6 illustrate examples of products which can be produced utilizing at least some of the described embodiments. FIG. 5 shows a diagrammatic representation of an exemplary printing device that can utilize an exemplary print cartridge. In this embodiment the printing device comprises a printer 500. The printer shown here is embodied in the form of an inkjet printer. The printer 500 can be capable of printing in black-and-white and/or in color. The term "printing device" refers to any type of printing device and/or image forming device that employs slotted substrate(s) to achieve at least a portion of its functionality. Examples of such printing devices can include, but are not limited to, printers, facsimile machines, and photocopiers. In this exemplary printing device the slotted substrates comprise a portion of a print head which is incorporated into a print cartridge, an example of which is described below.

FIG. 6 shows a diagrammatic representation of an exemplary print cartridge 600 that can be utilized in an exemplary printing device. The print cartridge is comprised of a print head 605 and a cartridge body 610 that supports the print head. Though a single print head 605 is employed on this print cartridge 600 other exemplary configurations may employ multiple print heads on a single cartridge.

Print cartridge 600 is configured to have a self-contained fluid or ink supply within cartridge body 610. Other print cartridge configurations alternatively or additionally may be configured to receive fluid from an external supply. Other exemplary configurations will be recognized by those of skill in the art.

It is therefore to be understood that this disclosure may be practiced otherwise than as specifically described. For example, the present disclosure is not limited to thermally actuated fluid ejection devices, but may also include, for example, mechanically actuated fluid ejection devices such as piezoelectric fluid ejection devices, and medical devices. In addition, the present disclosure is not limited to fluid ejection devices, but is applicable to any slotted substrates, such as for example, accelerometers (inertial sensors), fuel cells, flextensional devices, optical switching devices, data storage/memory devices and visual display devices. Thus, the present embodiments should be considered in all respects as illustrative and not restrictive, the scope should be indicated by the appended claims rather than the foregoing description.

What is claimed is:

1. A method of manufacturing a fluid ejection device comprising:

forming an insulating layer over a first side of a substrate;

forming a plurality of thin film layers overlying the insulating layer on the substrate;

creating at least one opening in the insulating layer and thin film layers to the substrate;

forming at least one orifice layer overlying the thin film layers and the at least one opening;

removing substrate material through a second side of the substrate to a first distance less than fifty microns from the first side of the substrate to form a slot; and anisotropic etching the slot for a time period so that a slot opening at the first side of the substrate is aligned with at least one opening of the insulating layer during anisotropic etching.

2. The method of claim 1 further comprising forming a plurality of fluid feed holes, fluid feed chambers, and orifices in the at least one orifice layer prior to etching the slot.

3. The method of claim 2 wherein the at least one orifice layer comprises a polymer and wherein forming the plurality of fluid feed holes, fluid feed chambers, and orifices comprises developing the polymer.

4. The method of claim 3 wherein the polymer is SU8.

5. The method of claim 1 further comprising forming a plurality of fluid feed holes, fluid feed chambers, and orifices in the at least one orifice layer after etching of the slot.

6. The method of claim 5 wherein the at least one orifice layer comprises a polymer and wherein forming the plurality of fluid feed holes, fluid feed chambers, and orifices comprises developing the polymer.

7. The method of claim 1 further comprising forming a masking layer over the second side of the substrate, patterning and etching the masking layer to form a second opening, and wherein removing substrate material through the second side comprises removing substrate material through the second opening.

8. The method of claim 1 wherein the etching comprises etching with at least one of TMAH, KOH, and other alkaline etchants.

9. The method of claim 1 wherein the insulating material consists of a thermally grown oxide.

10. The method of claim 1 wherein plugs or sacrificial layers are not utilized to align the at least one opening with the slot.

11. The method of claim 1 wherein removing comprises utilizing one or more of a plasma etching, deep reactive ion etching, laser machining, ultrasonic micromachining, and a saw to remove substrate material.

12. The method of claim 1 wherein removing comprises anisotropic etching.

13. The method of claim 12 wherein anisotropic etching comprises etching with at least one of TMAH, KOH, and other alkaline etchants.

14. The method of claim 1 wherein the material is silicon.

15. A method of manufacturing a fluid ejection device comprising:

forming an insulating layer over a first side of a substrate;

forming a plurality of resistors over the insulating layer on the substrate;

creating at least one gap in the insulating layer;

forming at least orifice layer overlying the resistors and at least one gap;

removing substrate material through a second side of the substrate to a first distance less than fifty microns from the first side of the substrate to form a slot; and anisotropic etching the slot so that a fluid passage is formed between the first side and the second side, wherein an opening of the slot at the first side is substantially aligned with the at least one gap during anisotropic etching.

16. The method of claim 15 further comprising forming a plurality of fluid feed holes, fluid feed chambers overlying each of the resistors, and orifices above the fluid feed chambers in the at least one orifice layer prior to an isotropic etching.

17. The method of claim 15 wherein the at least one orifice layer comprises a polymer.

18. The method of claim 17 wherein the polymer is SU8.

19. The method of claim 15 wherein anisotropic etching comprises etching with at least one of TMAH, KOH, and other alkaline etchants.

20. The method of claim 15 wherein the insulating material comprises a thermally grown oxide.

21. The method of claim 15 wherein plugs or sacrificial layers are not utilized to align the gap with the slot.

22. The method of claim 15 wherein the material is silicon.

* * * * *

UNITED STATES PATENT AND TRADEMARK OFFICE
CERTIFICATE OF CORRECTION

PATENT NO. : 7,473,649 B2
APPLICATION NO. : 11/492518
DATED : January 6, 2009
INVENTOR(S) : Steven D Leith et al.

It is certified that error appears in the above-identified patent and that said Letters Patent is hereby corrected as shown below:

In column 8, line 43, in Claim 16, delete “an isotropic” and insert -- anisotropic --, therefor.

Signed and Sealed this

Fifth Day of May, 2009

JOHN DOLL
*Acting Director of the United States Patent and Trademark Office*